(12) United States Patent
Kim

(10) Patent No.: US 8,355,420 B2
(45) Date of Patent: *Jan. 15, 2013

(54) LIGHT-EMITTING DEVICE AND MANUFACTURING METHOD THEROF

(75) Inventor: Kyong Jun Kim, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 12 days.

This patent is subject to a terminal disclaimer.

(21) Appl. No.: 12/942,945

(22) Filed: Nov. 9, 2010

(65) Prior Publication Data

US 2011/0049543 A1    Mar. 3, 2011

Related U.S. Application Data

(63) Continuation of application No. 11/515,721, filed on Sep. 6, 2006, now Pat. No. 7,848,374.

(30) Foreign Application Priority Data

Sep. 6, 2005  (KR) .................. 10-2005-0082737

(51) Int. Cl.
  *H01S 5/00*    (2006.01)
(52) U.S. Cl. ............... 372/45.01; 372/43.01; 372/81; 438/47
(58) Field of Classification Search ............. 372/45.01
See application file for complete search history.

(56) References Cited

U.S. PATENT DOCUMENTS

| | | | |
|---|---|---|---|
| 4,333,061 A | 6/1982 | Sasatani | |
| 4,779,280 A * | 10/1988 | Sermage et al. | 372/45.01 |
| 5,798,537 A | 8/1998 | Nitta | |
| 5,814,532 A * | 9/1998 | Ichihara | 438/33 |
| 5,866,440 A * | 2/1999 | Hata | 438/46 |
| 5,932,896 A * | 8/1999 | Sugiura et al. | 257/94 |
| 6,111,902 A | 8/2000 | Kozlov et al. | |
| 6,411,636 B1 * | 6/2002 | Ota et al. | 372/43.01 |
| 6,487,231 B1 * | 11/2002 | Boucart et al. | 372/96 |
| 7,848,374 B2 * | 12/2010 | Kim | 372/45.01 |
| 2006/0267034 A1 | 11/2006 | Orita | |
| 2009/0325334 A1 | 12/2009 | Kwak et al. | |

FOREIGN PATENT DOCUMENTS

| | | |
|---|---|---|
| KR | 10-2002-0048546 A | 6/2002 |
| KR | 10-2004-0090465 A | 10/2004 |

* cited by examiner

*Primary Examiner* — Armando Rodriguez
*Assistant Examiner* — Xinning Niu
(74) *Attorney, Agent, or Firm* — Birch, Stewart, Kolasch & Birch, LLP

(57) ABSTRACT

Provides is a semiconductor light-emitting device. The semiconductor light-emitting device includes a first conduction-type cladding layer, an active layer, and a second conduction-type cladding layer, on a substrate. Portions of the substrate and the first conduction-type cladding layer are removed. According to the light-emitting device having the above-construction, damage to a grown epitaxial layer is reduced, and a size of an active layer increases, so that a light-emission efficiency increases. Even when a size of a light-emitting device is small, a short-circuit occurring between electrodes can be prevented. Further, brightness and reliability of the light-emitting device are improved.

19 Claims, 4 Drawing Sheets

LIGHT-EMITTING DEVICE AND MANUFACTURING METHOD THEROF

CROSS-REFERENCE TO RELATED APPLICATIONS

This application is a continuation of application Ser. No. 11/515,721 filed on Sep. 6, 2006 now U.S. Pat. No. 7,848,374, which claims the benefit of priority of Korean Patent Application No. 10-2005-0082737 filed on Sep. 6, 2005. All these applications are incorporated by reference in their entirety herein.

BACKGROUND OF THE INVENTION

1. Field of the Invention

The present invention relates to a nitride semiconductor light-emitting device.

2. Description of the Related Art

Generally, a light-emitting device is a kind of a semiconductor device used for converting electricity into an infrared or light using a characteristic of a compound semiconductor to transmit and receive a signal. The light-emitting device is widely used for home appliances, remote controllers, display boards, display apparatuses, and a variety of automation apparatuses.

In operation, when a forward voltage is applied to a semiconductor formed of a predetermined element, an electron and a hole recombine at a positive-negative junction portion. At this point, an energy level falls down due to recombination of an electron-hole pair, so that light is emitted.

Also, a light-emitting device is generally manufactured in a very small size of 0.23 mm$^2$, and provided in a structure in which the light-emitting device is mounted in a printed circuit board (PCB) using an epoxy mold and a lead frame. A light-emitting device most widely used currently is a 5-mm plastic package but is not limited thereto and a new type of package is under development depending on a predetermined application. A wavelength of light emitted from a light-emitting device is determined by a combination of elements constituting a semiconductor chip.

A related art nitride light-emitting device will be described with reference to the accompanying drawings.

FIG. 1 is a cross-sectional view of a related art light-emitting device. A light-emitting device, which will be described below, is a light-emitting device using a nitride semiconductor, specifically, a gallium nitride.

Referring to FIG. 1, the related art light-emitting device includes a buffer layer 20, un-doped GaN layer 30, an n-type first conduction-type cladding layer 40, an active layer 60, a p-type second conduction-type cladding layer 70, an n-type electrode 50, and a p-type electrode 80 sequentially formed on a substrate 10 exemplified as a sapphire substrate.

A method for manufacturing the related art light-emitting device is sequentially descried in detail.

First, the buffer layer 20 is formed on the substrate 10 in order to grow high quality nitride, so that a planarization of the substrate 10 is increased. For example, melt-back etching caused by a chemical reaction of the substrate 10 is prevented.

Also, the un-doped GaN layer 30 grows the n-type first conduction-type cladding layer 40 thereon, as a base layer for various semiconductor layers to be formed on the buffer layer 20.

Subsequently, the active layer 60 and the p-type second conduction-type cladding layer 70 are grown on the n-type first conduction-type cladding layer 40.

Here, the active layer 60 having a multiple quantum well (MQW) structure is a layer where holes flowing through the p-type electrode 80 and electros flowing through the n-type electrode 50 recombine, thereby emitting light.

With this state, the n-type electrode 50 is electrically connected on an upper portion of the n-type first conduction-type cladding layer 40, which is a portion on which the p-type second conduction-type cladding layer 70 and the active layer 60 are not grown, more strictly, a portion exposed by growing at least the p-type second conduction-type cladding layer 70 and the active layer 60 and then removing a portion of the grown layers 70 and 60. Also, the p-type electrode 80 is electrically connected on the p-type second conduction-type cladding layer 70.

When a voltage is applied to the light-emitting device through the n-type electrode 50 and the p-type electrode 80, electrons are injected to the active layer 60 from the n-type first conduction-type cladding layer 40, and holes are injected to the active layer 60 from the p-type second conduction-type cladding layer 70. At this point, the electros and holes injected into the active layer 60 recombine to generate light.

As described above, a sapphire substrate of substrates of various materials are generally used in the nitride light-emitting device. Although a sapphire substrate has an insulation characteristic and shows a high lattice mismatch of about 15-17% with respect to a GaN-based semiconductor material, the sapphire substrate is thermally stable and thus has little thermal damage at a range of about 1,000-1,200° C. during an epitaxial layer growth that uses metal oxide chemical vapor deposition (MOCVD). Also, the sapphire substrate is known as a high quality material of low defect concentration.

However, since the sapphire substrate in an insulator, a rear side contact is impossible during a device fabrication, so that there are lots of difficulties during a manufacturing process. Accordingly, it is general to perform a contact by performing dry-etching on a portion of a grown epitaxial layer, which is known in detail to the related art.

When dry-etching is performed on a related art nitride light-emitting device to etch a portion of an already grown epitaxial layer, a light-emitting area is reduced. When a chip size is reduced, an interval between a p-type electrode and an n-type electrode narrows, there is a high possibility that a short-circuit between the electrodes occurs. Also, there is a problem that a grown epitaxial layer is damaged during dry-ing etching, and generates a defect, resulting in reduction of a light-emission efficiency. Consequently, these problems reduce brightness and reliability of a light-emitting device.

SUMMARY OF THE INVENTION

The present invention provides a light-emitting device and a manufacturing method thereof, capable of preventing a short-circuit between electrodes and improving a light-emission efficiency, brightness and reliability of the light-emitting device.

There is provided a light-emitting device including a first conduction-type cladding layer, an active layer, and a second conduction-type cladding layer stacked on a substrate, wherein portions of the substrate and the first conduction-type cladding layer are removed.

There is provided a semiconductor light-emitting device including a substrate, a first conduction-type cladding layer, an active layer, a second conduction-type cladding layer stacked, wherein a portion of the substrate is removed such that a lower surface of the first conduction-type cladding layer is exposed.

There is provided a method for manufacturing a light-emitting device, the method including: forming a first conduction-type cladding layer, an active layer, and a second conduction-type cladding layer on a substrate; lapping the substrate; etching at least the substrate to expose a portion of the first conduction-type cladding layer; and forming a first electrode on a lower surface of the exposed first conduction-type cladding layer and forming a second electrode on an upper surface of the second conduction-type cladding layer.

There is provided a method for manufacturing a light-emitting device, the method including: forming a first conduction-type cladding layer, an active layer, and a second conduction-type cladding layer on a substrate; etching at least a portion of the substrate from its lower portion to expose a portion of the first conduction-type cladding layer; and forming a first electrode on a lower surface of the exposed first conduction-type cladding layer and forming a second electrode on an upper surface of the second conduction-type cladding layer.

According to the present invention, a damage that can be caused on an already grown epitaxial layer can be reduced, and an area of an active layer is increased, so that a light-emission efficiency increases.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
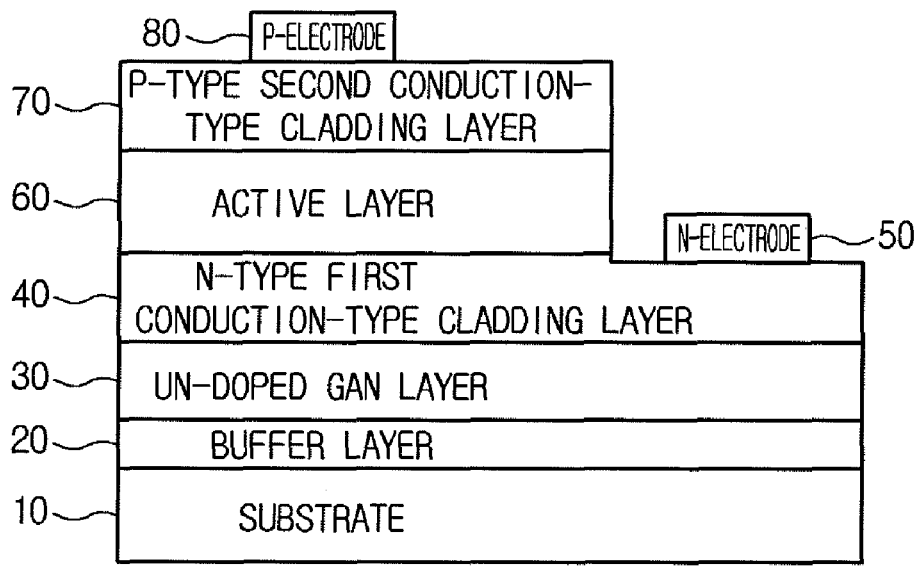
FIG. 1 is a cross-sectional view of a nitride light-emitting device according to a related art.

Reference will now be made in detail to the preferred embodiments of the present invention, examples of which are illustrated in the accompanying drawings.

FIGS. 2A to 2F are cross-sectional views sequentially explaining a process for manufacturing a light-emitting device according to the present invention.

First, in embodiments of the present invention, a nitride semiconductor using a compound such as GaN, AlN, and InN belonging to a group III and a group V can be independently used or used in combination for the light-emitting device. For example, referring to FIG. 2A, a light-emitting device includes a buffer layer 200, an un-doped GaN layer 300, a first conduction-type cladding layer 400, an active layer 500, and a second conduction-type cladding layer 600 sequentially stacked on a substrate 100 exemplified as a sapphire substrate.

In detail, the buffer layer 200 formed on the substrate 100 is intended for increasing a planarization of the substrate 100 to grow a high quality nitride. For example, a melt-back etching caused by a chemical reaction of the substrate 100 is prevented.

Also, the first conduction-type cladding layer 400 is grown on an upper surface of the un-doped GaN layer 300 which is a base layer for various semiconductor layers to be formed on the buffer layer 200.

The active layer 500 having a multiple quantum well (MQW) structure is a layer where holes flowing through the second electrode 900 and electrons flowing through the first electrode 800 recombine to generate light.

A second conduction-type cladding layer 600 is formed on the active layer 500.

Here, the first conduction-type cladding layer 400 may be an n-type layer, and the second conduction-type cladding layer 600 may be a p-type layer. Of course, conversely, the first conduction-type cladding layer 400 may be a p-type layer, and the second conduction-type cladding layer 600 may be an n-type layer.

Figure 2A:
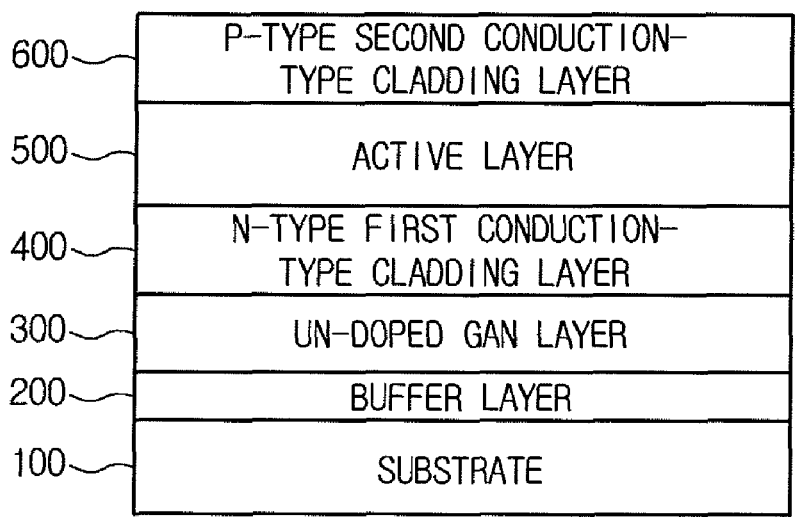
FIGS. 2A to 2F are cross-sectional views sequentially explaining a process for manufacturing a light-emitting device according to embodiments of the present invention.
Figure 2B:
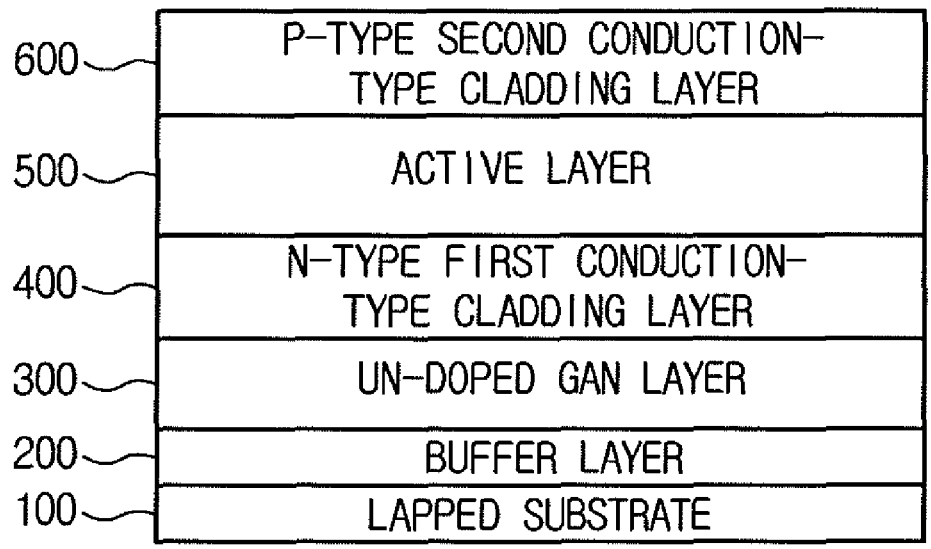

After that, in the light-emitting device having the above-construction, a back side of the sapphire substrate 100 is lapped up to a thickness of 50 µm (that is, until the substrate has a thickness 50 µm) as is illustrated in FIG. 2B. Lapping the sapphire substrate 100 can prevent absorption of light emitted from the active layer 500. Furthermore, an etching process of the sapphire substrate 100 that is to be performed, can be performed fast and conveniently even more.

Figure 2C:
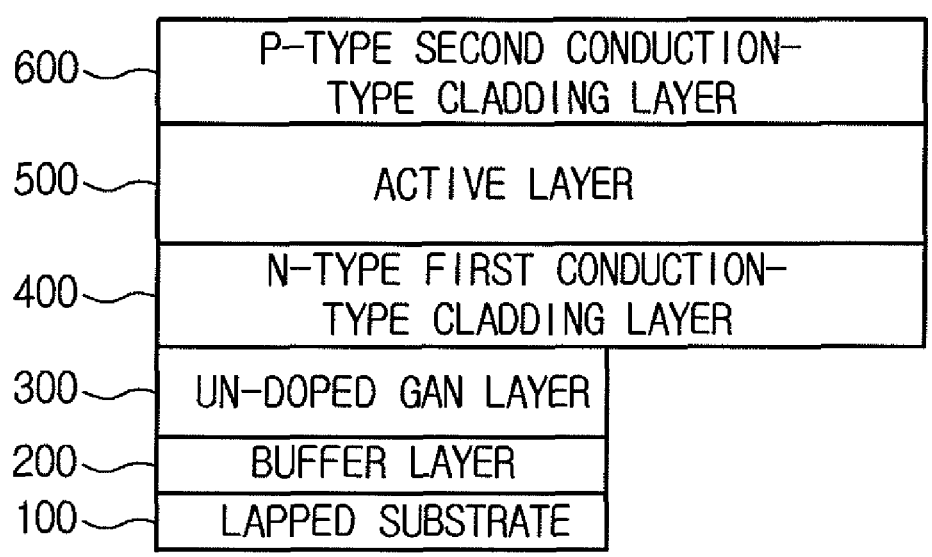

Subsequently, referring to FIG. 2C, a portion of the lapped sapphire substrate 100 is etched such that a portion of the first conduction-type cladding layer 400 is exposed. Here, the etching is performed using one of $BCl_3$ and $Cl_2$.

Figure 2D:
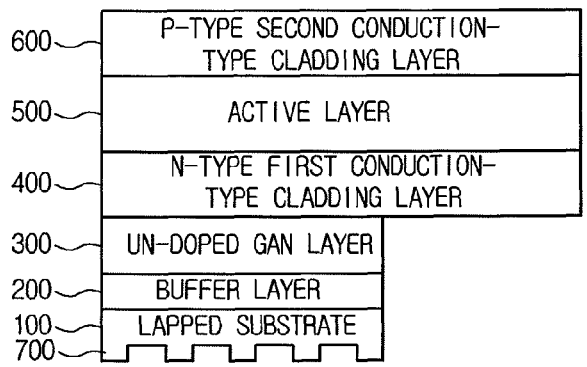

After that, referring to FIG. 2D, a lower surface of the lapped substrate 100 that is not etched is texture-processed using various patterns to form a texture processed portion 700.

The pattern is one of a quadrangular shape, a lens shape, a trapezoid, and so forth. This texture process can enhance a light-emission efficiency.

Figure 2E:
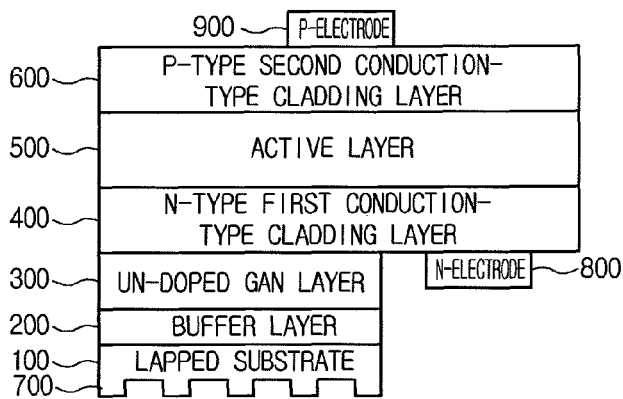

Referring to FIG. 2E, a first electrode 800 is formed on the exposed portion (lower surface) of the first conduction-type cladding layer 400. A second electrode 900 is formed on the second conduction-type layer 600. At this point, the second electrode 900 may be a transparent electrode formed of at least one material selected from the group consisting of ITO, IZO (In—ZnO), GZO (Ga—ZnO), AZO (Al—ZnO), AGZnO (Al—Ga ZnO), IGZnO (In—Ga ZnO), and $IrO_x$.

FIG. 2E explains a light-emitting device completely manufactured. The buffer layer 200, the un-doped GaN layer 300, the first conduction-cladding layer 400, the active layer 500, and the second conduction-type cladding layer 600 are sequentially formed on the lapped substrate 100. Also, with portions of the lapped substrate 100, the buffer layer 200, the un-doped GaN layer 300 etched, the electrode 800 is formed on a lower surface of the first conduction-type cladding layer 400. The electrode 900 is formed on an upper surface of the second conduction-type cladding layer 600. The texture processed portion 700 is formed on a lower surface of the lapped substrate 100.

Since a light-emitting device etches a portion of a backside of a sapphire substrate, a damage of a grown epitaxial layer can be prevented. Also, since an area of the active layer is increased, a light-emission efficiency is increased. Since the substrate is lapped, light absorption is prevented, so that a light-emission efficiency can be enhanced. Since a texture processed portion is provided in a lower surface of the substrate, a light-emission efficiency can be enhanced even more.

When a voltage is applied to the light-emitting device through the first electrode 800 and the second electrode 900, electrons are injected to the active layer 500 from the first conduction-type cladding layer 400, and holes are injected to the active layer 500 from the second conduction-type cladding layer 600. At this point, the electros and holes injected into the active layer 500 recombine to generate light. Here, since the active layer 500 is not etched and thus has a wide light-emission area, a light-emission efficiency is improved, and the lapped substrate 100 and the texture processed portion 700 enhances a light-emission efficiency even more.

Figure 2F:
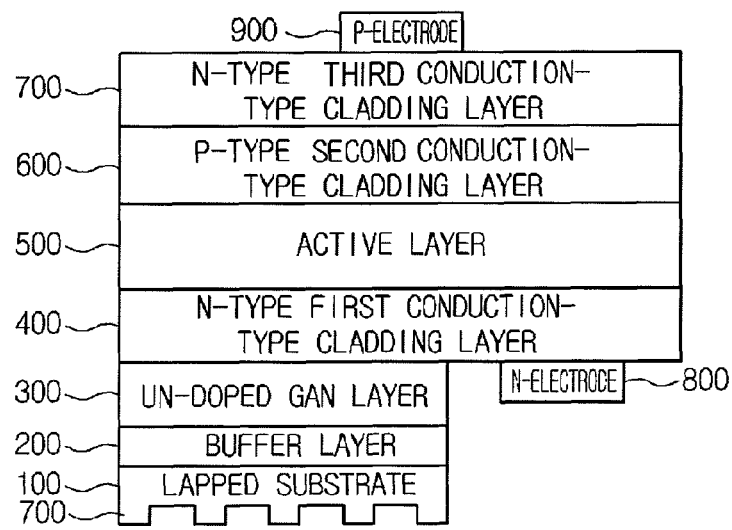

Though the above description of the present invention has been made for a p-n junction structure, as can be seen in FIG. 2f, the present invention can be applied to a nitride light-emitting device having an n-p-n junction structure where a third conduction-type cladding layer 700, which is an n-type cladding layer, is further formed on an upper surface of a second conduction-type cladding layer, which is a p-type cladding layer. Here, in the nitride light-emitting device having the n-p-n junction structure, each of a first cladding layer and a third cladding layer is an n-type cladding layer, and a p-type cladding layer is interposed between the first and third cladding layers. At this point, the first electrode is formed on the first cladding layer, which is an n-type cladding layer, and the second electrode is formed on the third cladding layer, which is an n-type cladding layer.

Also, the electrode does not directly contact the cladding layer but various type electrode layers may be further formed, which also comes within the scope of the present invention.

Figure 3:
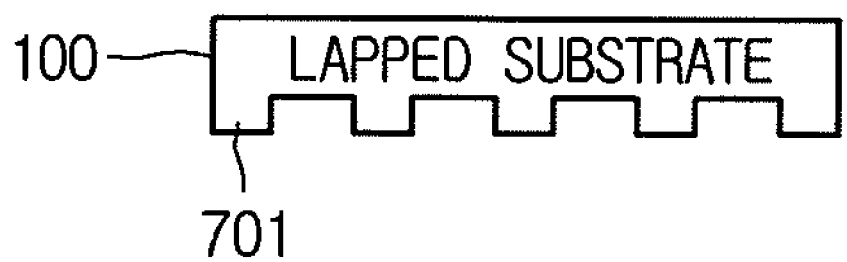
FIGS. 3-5 are views illustrating a texture pattern of a light-emitting device according to embodiments of the present invention.
Figure 4:
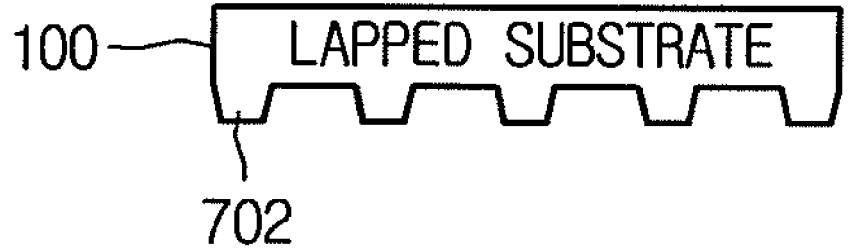
Figure 5:

FIGS. 3 to 5 are cross-sectional views illustrating a texture shape of a light-emitting device according to the present invention. FIG. 3 illustrates a quadrangular texture processed portion 701, FIG. 4 illustrates a trapezoid texture processed portion 702, and FIG. 5 illustrates a circular texture processed portion 703. Of course, pluralities of layers are further formed on an upper surface of the lapped substrate 100 in FIGS. 3 to 5.

As described above, since a portion of a backside of a sapphire substrate is etched in a light-emitting device according to the present invention, damages to a grown epitaxial layer can be reduced. Also, since an area of the active layer is increased, a light-emission efficiency is increased.

Also, a short-circuit occurring between electrodes can be prevented even when a light-emitting device is small in size. Further, a backside of a substrate is texture-processed using various patterns, so that a light-emission efficiency is enhanced even more.

Meanwhile, the present invention can have various other embodiments within the scope to the sprit of the present invention is applied. For example, another layer can be interposed between an active layer and a cladding layer to reduce a lattice defect. Furthermore, another layer can further intervene between various layers described in the embodiments. Therefore, other layer stacked on one layer in the embodiments can be directly staked as described, and another layer can further intervene in order to enhance a light-emission efficiency of a light-emitting device.

What is claimed is:

1. A semiconductor light-emitting device, comprising:
a light emitting structure including a first conduction-type cladding layer, a second conduction-type cladding layer, and an active layer between the first conduction-type cladding layer and second conduction-type cladding layer;
a non-conductive substrate under a first portion of the light emitting structure, and the first portion and the non-conductive substrate each having a horizontal surface area smaller than a horizontal surface area of the active layer;
a first electrode electrically connected to the first conduction-type cladding layer and disposed under the first conduction-type cladding layer; and
a second electrode electrically connected to the second conduction-type cladding layer and disposed on the second conduction-type cladding layer,
wherein the first conduction-type cladding layer is partially contacted with the first electrode, and
wherein the non-conductive substrate comprises a bottom surface which is not in direct contact with the first electrode.

2. The semiconductor light-emitting device according to claim 1,
wherein the first electrode is disposed under a second portion of the light emitting structure, and
wherein a horizontal surface area of the first electrode is smaller than a horizontal surface area of the second portion.

3. The semiconductor light-emitting device according to claim 2, wherein the horizontal surface area of the second portion is smaller than the horizontal surface area of the first portion.

4. The semiconductor light-emitting device according to claim 2, wherein the horizontal surface area of the first electrode is in direct contact with the first conduction-type cladding layer.

5. The semiconductor light-emitting device according to claim 2, wherein the horizontal surface areas of the first and second portions do not overlap.

6. The semiconductor light-emitting device according to claim 1, wherein no portion of the non-conductive substrate is in direct contact with the first electrode.

7. The semiconductor light-emitting device according to claim 1, further comprising:
a buffer layer between the non-conductive substrate and the light emitting structure, the buffer layer having a horizontal surface area smaller than the horizontal surface area of the active layer.

8. The semiconductor light-emitting device according to claim 7, further comprising:
an un-doped GaN layer between the buffer layer and the light emitting structure, the un-doped GaN layer having a horizontal surface area smaller than the horizontal surface area of the active layer.

9. The semiconductor light-emitting device according to claim 1, wherein the non-conductive substrate is a sapphire substrate.

10. The semiconductor light-emitting device according to claim 1, wherein the bottom surface of the non-conductive substrate comprises a texture processed portion.

11. The semiconductor light-emitting device according to claim 10, wherein the texture processed portion includes a pattern including one of a quadrangular shape, a lens shape, and a trapezoid shape.

12. The semiconductor light-emitting device according to claim 1, further comprising:
a third conduction-type cladding layer between the second conduction-type cladding layer and the second electrode, wherein the first conduction-type cladding layer is an n-type cladding layer and the second conduction-type cladding layer is an p-type cladding layer and the third conduction-type cladding layer is an n-type cladding layer.

13. The semiconductor light-emitting device according to claim 1, wherein the first electrode is not overlapped with the second electrode in a vertical direction.

14. A method for manufacturing a light-emitting device, the method comprising:
forming a light emitting structure including a first conduction-type cladding layer, a second conduction-type cladding layer, and an active layer between the first conduction-type cladding layer and second conduction-type cladding layer on a non-conductive substrate;

lapping the non-conductive substrate;

removing a portion of the non-conductive substrate by etching to expose a portion of the first conduction-type cladding layer so that the non-conductive substrate which is unetched has an exposed horizontal bottom surface area smaller than a horizontal surface area of the active layer;

forming a first electrode electrically connected to the first conduction-type cladding layer on a corresponding etched portion of the light emitting structure only, where the portion of the non-conductive substrate is removed; and forming a second electrode electrically connected to the second conduction-type cladding layer, wherein the first conduction-type cladding layer is partially contacted with the first electrode.

15. The method according to claim 14, wherein the horizontal surface area of the etched portion is smaller than a horizontal surface area of a corresponding unetched portion of the light emitting structure, wherein the first electrode is in direct contact with the first conduction-type cladding layer and has a horizontal surface area smaller than the horizontal surface area of the etched portion.

16. The method according to claim 14, wherein first electrode has a horizontal surface area smaller than the horizontal surface area of the etched portion.

17. The method according to claim 14, wherein no portion of the non-conductive substrate is in direct contact with the first electrode.

18. The method according to claim 14, further comprising:
forming a buffer layer between the non-conductive substrate and the light emitting structure, the buffer layer having a horizontal surface area smaller than the horizontal surface area of the active layer.

19. The method according to claim 18, further comprising:
forming an un-doped GaN layer between the buffer layer and the light emitting structure, the un-doped GaN layer having a horizontal surface area smaller than the horizontal surface area of the active layer.

\* \* \* \* \*